(12) United States Patent
Wang et al.

(10) Patent No.: US 11,705,532 B2
(45) Date of Patent: Jul. 18, 2023

(54) X-RAY DEVICE

(71) Applicant: InnoCare Optoelectronics Corporation, Tainan (TW)

(72) Inventors: Zhi-Hong Wang, Tainan (TW); Hsin-Hung Lin, Tainan (TW); Chih-Hao Wu, Tainan (TW)

(73) Assignee: InnoCare Optoelectronics Corporation, Tainan (TW)

( * ) Notice: Subject to any disclaimer, the term of this patent is extended or adjusted under 35 U.S.C. 154(b) by 0 days.

(21) Appl. No.: 17/242,321

(22) Filed: Apr. 28, 2021

(65) Prior Publication Data

US 2021/0376178 A1     Dec. 2, 2021

(30) Foreign Application Priority Data

May 26, 2020   (TW) ................................. 109117480

(51) Int. Cl.
*H01L 31/08*        (2006.01)
*H01L 31/18*        (2006.01)
*H01L 31/0224*      (2006.01)

(52) U.S. Cl.
CPC .... *H01L 31/085* (2013.01); *H01L 31/022466* (2013.01); *H01L 31/1816* (2013.01)

(58) Field of Classification Search
CPC ......... H01L 27/14658; H01L 27/14676; H01L 27/14609; H01L 27/14603
See application file for complete search history.

(56) References Cited

U.S. PATENT DOCUMENTS

| 2005/0274991 | A1* | 12/2005 | Ishii | .................. | H01L 27/14603 |
| | | | | | 257/E27.132 |
| 2006/0175609 | A1 | 8/2006 | Chan et al. | | |
| 2017/0263657 | A1* | 9/2017 | Chu | ..................... | H01L 27/1462 |

FOREIGN PATENT DOCUMENTS

| CN | 101325207 | 12/2008 |
| TW | 201901945 | 1/2019 |

* cited by examiner

*Primary Examiner* — Calvin Y Choi
(74) *Attorney, Agent, or Firm* — JCIPRNET

(57) ABSTRACT

An X-ray device including a sensing panel is provided. The sensing panel includes a first pixel and a second pixel. The second pixel is disposed adjacent to the first pixel in a top view direction. The first pixel includes a first photoelectric conversion layer. The second pixel includes a second photoelectric conversion layer. The first photoelectric conversion layer and the second photoelectric conversion layer belong to different layers.

8 Claims, 4 Drawing Sheets

X-RAY DEVICE

CROSS-REFERENCE TO RELATED APPLICATION

This application claims the priority benefit of Taiwan application serial no. 109117480, filed on May 26, 2020. The entirety of the above-mentioned patent application is hereby incorporated by reference herein and made a part of this specification.

BACKGROUND

1. Technical Field

The disclosure relates to an X-ray device.

2. Description of Related Art

The image quality of an x-ray device is related to the fill factor (FF) of a photosensitive element. In general, the larger the fill factor, the better. The current practice is to increase the fill factor by increasing the area of the photoelectric conversion layer in the pixel as much as possible. However, at present, the photoelectric conversion layers of all pixels in the x-ray device belong to the same layer, and the photoelectric conversion layers of adjacent pixels need to maintain an appropriate distance, or other circuits need to be disposed between the adjacent photoelectric conversion layers. These circuits may shield the photoelectric conversion layer, making it difficult for the area photoelectric conversion layer to be effectively increased.

SUMMARY

The disclosure provides an x-ray device having good image quality.

The embodiments of the disclosure provide an x-ray device that includes a sensing panel. The sensing panel includes a first pixel and a second pixel. The second pixel and the first pixel are disposed adjacent to each other in a top view direction. The first pixel includes a first photoelectric conversion layer. The second pixel includes a second photoelectric conversion layer. The first photoelectric conversion layer and the second photoelectric conversion layer belong to different layers.

In order to make the above-mentioned features and advantages of the disclosure more comprehensible, the embodiments are specifically described below in detail in conjunction with the accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
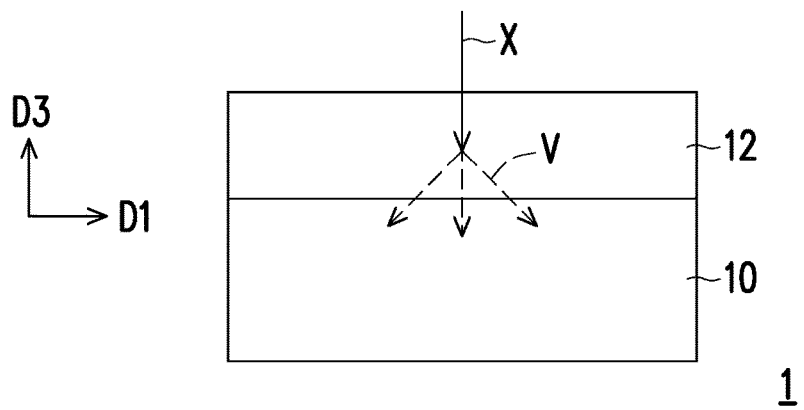
FIG. 1 is a schematic cross-sectional view of an X-ray device according to an embodiment of the disclosure.

The disclosure can be understood by reference to the following detailed description in conjunction with the accompanying drawings. It should be noted that in order to make it easy for readers to understand and for the sake of simplicity of drawings, the multiple drawings in the disclosure show only part of the electronic device, and the specific elements in the drawings are not drawn according to actual scale. In addition, the number and size of each element in the drawings are for illustrative purposes only and are not used to limit the scope of the disclosure. For example, for clarity, the relative size, thickness, and position of each film layer, region, and/or structure may be reduced or enlarged.

Certain terms are used throughout the disclosure and the accompanying claims to refer to specific elements. Those of ordinary skill in the art will understand that electric device makers may refer to the same elements under different names. The disclosure does not intend to distinguish between elements having the same function but different names. In the following description and claims, the words "having" and "including" are open-ended words and should be interpreted as "including but not limited to . . . ".

Directional terms mentioned in the disclosure, such as: "upper", "lower", "front", "back", "left", "right" and the like are only directions referring to the drawings. Therefore, these directional terms used is to illustrate, not to limit, the disclosure. It should be understood that when an element or a film layer is referred to as being disposed "on" or "connected" to another element or film layer, the element or film layer can be located directly on the other element or film layer or directly connected to the other element or film layer, or there may be an interposed element or film layer between the two (indirect case). On the contrary, when an element or film layer is referred to as being disposed "directly on" or "directly connected to" another element or film layer, no interposed element or film layer exists between the two.

The terms "approximately", "equal", "equivalent", "same", "substantially", or "roughly" mentioned in the disclosure generally mean falling within 10% of a given value or range, or within 5%, 3%, 2%, 1% or 0.5% of a given value or range. In addition, the terms "the given range is from a first value to a second value" and "the given range falls within the range of the first value to the second value" mean that the given range includes the first value, the second value, and other values between the two.

In some embodiments of the disclosure, unless specifically defined, terms such as "join" and "connect" with respect to bonding and connection may mean that two structures are in direct contact, or that two structures are not in direct contact where some other structures are disposed between the two structures. The terms "join" and "connect" may also include the case where both structures are movable or both structures are fixed. In addition, the terms "electrically connected" and "coupled" include any direct and indirect means of electrical connection.

In the following embodiments, the same or similar elements will have the same or similar reference numerals and their detailed descriptions will be omitted. Further, the features of the different embodiments may be used in any combination as long as they do not violate the spirit of the disclosure or conflict with each other, and any simple equivalent changes and modifications in accordance with the disclosure or claims still remain within the scope of the disclosure. In addition, the terms "first" and "second" mentioned in the disclosure are used only to name different elements or distinguish different embodiments or ranges, not to limit the upper limit or the lower limit on the number of elements or limit the manufacturing order or disposition order of elements.

Figure 2:
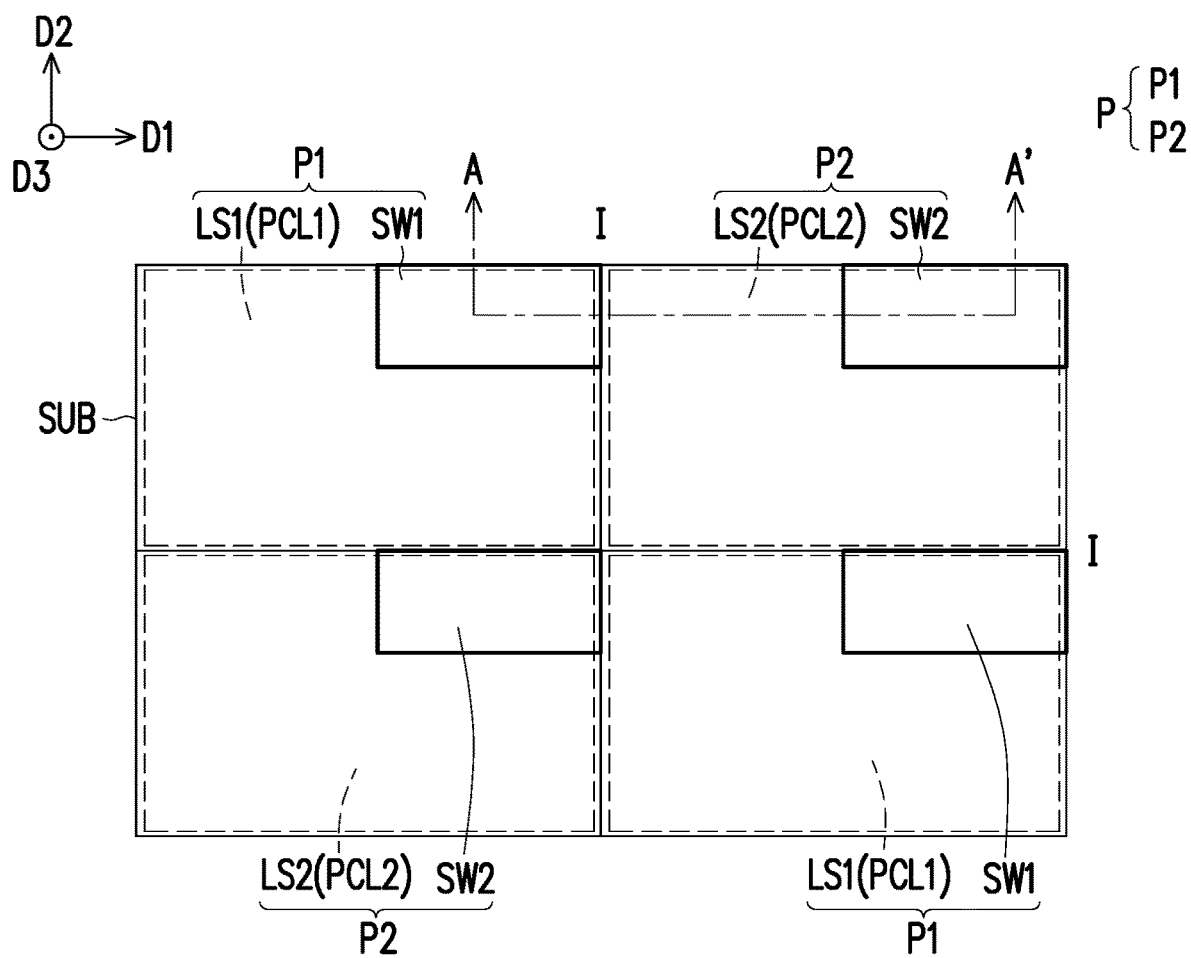
FIG. 2 is a partial schematic top view of a sensing panel in FIG. 1.
Figure 3:
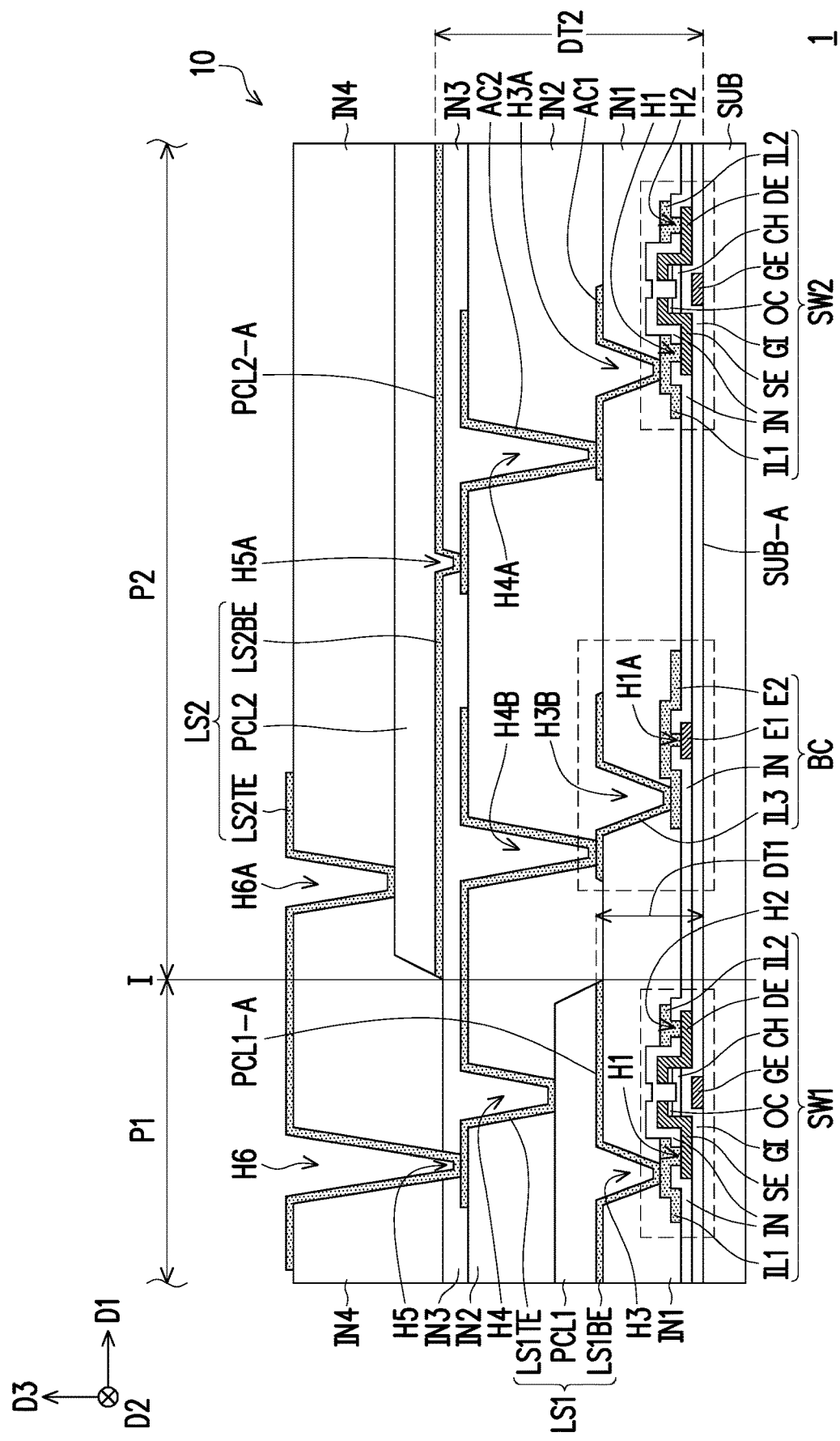
FIG. 3 is a schematic cross-sectional view of a section line A-A' of FIG. 2.

FIG. 1 is a schematic cross-sectional view of an X-ray device 1 according to an embodiment of the disclosure. FIG. 2 is a partial schematic top view of a sensing panel 10 in FIG. 1. FIG. 3 is a schematic cross-sectional view of the section line A-A' of FIG. 2.

Please refer to FIGS. 1 to 3. The x-ray device 1 may include the sensing panel 10 and a scintillator layer 12. The sensing panel 10 includes multiple pixels P. The scintillator layer 12 is disposed on the sensing panel 10, and the scintillator layer 12 is disposed, for example, on the multiple pixels P. The scintillator layer 12 is for converting the X-ray X entering the X-ray device 1 into a visible light V. For example, the material of the scintillator layer 12 may include cesium iodide (CsI), but the disclosure is not limited thereto. In other embodiments, the material of the scintillator layer 12 may include other types of inorganic scintillators or organic scintilaltors. Please refer to FIG. 2. The photoelectric conversion layers of the multiple pixels P, such as a photoelectric conversion layer PCL1 or a photoelectric conversion layer PCL2, may receive the visible light V and generate corresponding electrical signals.

According to different requirements, the X-ray device 1 may also include other film layers. For example, the x-ray device 1 may further include an encapsulation layer (not shown). The encapsulation layer may be disposed on the scintillator layer 12 and completely cover the scintillator layer 12. The encapsulation layer may be a stacked layer of one or more function layers. For example, the encapsulation layer may include an adhesive layer, a reflective layer, and a water blocking layer. The adhesive layer, the reflective layer, and the water blocking layer may be sequentially disposed on the scintillator layer 12. The encapsulation layer may be attached to the scintillator layer 12. The reflective layer is adapted to allow x-rays to pass through and reflect the visible light. In this way, the reflective layer can reflect the visible light in the external ambient light and reduce the interference of the visible light in the external ambient light on the sensing result. In addition, the reflective layer may also recover the visible light generated by the scintillator layer 12. For example, when the visible light V hits the reflective layer, the visible light V can be reflected by the reflective layer and transmitted in a direction toward the sensing panel 10, thus improving the recovery rate of the visible light V. The water blocking layer is adapted to reduce the probability of moisture penetrating into the scintillator 12 and can reduce the negative effect of water vapor on the scintillator 12 or can prolong the service life of the scintillator layer 12.

In some embodiments, the x-ray device 1 may further include a circuit board (not shown) electrically connected to the sensing panel 10 and a housing (not shown) accommodating the sensing panel 10, the scintillator layer 12, the encapsulation layer, and the circuit board.

Please refer to both FIG. 2 and FIG. 3. The multiple pixels P located in the sensing panel 10 may include multiple first pixels P1 and multiple second pixels P2. In an embodiment, the photoelectric conversion layers PCL1 of the multiple first pixels P1 and the photoelectric conversion layers PCL2 of the multiple second pixels P2 belong to different layers. It is worth noting that although the embodiment takes the multiple first pixels P1 and he multiple second pixels P2 as an example, the disclosure is not limited thereto. In another embodiment, the multiple pixels P may further include multiple third pixels (not shown), and the photoelectric conversion layers (not shown) in the multiple third pixels are different from the photoelectric conversion layers PCL1 and the photoelectric conversion layers PCL2. The multiple second pixels P2 and the multiple first pixels P1 are disposed adjacent to each other in a top view direction (for example in a normal direction D3 of a substrate SUB). In an embodiment, the multiple first pixels P1 and the multiple second pixels P2 may be alternately disposed in a first direction D1 and a second direction D2 (as shown in FIG. 2). The first direction D1 and the second direction D2 are different. In an embodiment, the first direction D1 and the second direction D2 are perpendicular to each other, but the disclosure is not limited thereto. In addition, the first direction D1 and the second direction D2 both are perpendicular to the normal direction D3 of the substrate SUB of the x-ray device 1. FIG. 2 schematically illustrates four pixels located in the sensing panel 10, and the four pixels constitute, for example, one pixel unit. It is worth noting that the disclosure is not limited to four pixels and may be based on design requirements. For example, in an embodiment including the third pixel, a pixel unit may include nine pixels. A pixel unit may also include sixteen pixels or other suitable numbers of pixels, as long as the effect of the disclosure is achieved. The sensing panel 10 may include an array disposed by multiple pixel units to sense images.

The sensing panel 10 may further include the substrate SUB, and the multiple pixels P (such as the multiple first pixels P1 and the multiple second pixels P2) are disposed on the substrate SUB. According to different requirements, the substrate SUB may be a hard substrate or a flexible substrate, and the material of the substrate SUB may include, for example, glass, quartz, ceramics, sapphire, or plastics, but the disclosure is not limited thereto. In another embodiment, the material of the substrate SUB may include suitable opaque material. In some embodiments, when the substrate SUB is a flexible substrate, suitable flexible materials may be included, such as, but not limited to, polycarbonate (PC), polyimide (PI), polypropylene (PP), polyethylene terephthalate (PET), or other suitable materials or a combination of the above-mentioned materials. In addition, the transmittance of the substrate SUB is not limited; in other words, the substrate SUB may be a transparent substrate, a semi-transparent substrate, or an opaque substrate.

At least one first pixel P1 of the multiple first pixels P1 may include a switching element SW1 (also referred to as a first switching element) and a photosensitive element LS1 (also referred to as a first photosensitive element), and at least one second pixel P2 of the multiple second pixels P2 may include a switching element SW2 (also referred to as a second switching element) and a photosensitive element LS2 (also referred to as a second photosensitive element). In an embodiment, each first pixel P1 includes the switching element SW1 and the photosensitive element LS1. Similarly, each second pixel P2 includes the switching element SW2 and the photosensitive element LS2. The switching element SW1 and/or the switching element SW2 include at least one switching unit such as a thin film transistor, and the photosensitive element LS1 and/or the photosensitive element LS2 include at least one photosensitive unit. In detail, according to different requirements, the number of switching units may be greater than or equal to one. In addition, the switching element SW1 and/or the switching element SW2 may further include other units according to requirements. For example, the switching element SW1 and/or the switching element SW2 may include three switching units and one capacitor unit (i.e. a 3T1C pixel structure). The capacitor unit is, for example, a capacitor or a storage capacitor, but the disclosure is not limited thereto.

FIG. 3 is a schematic cross-sectional view of the section line A-A' of FIG. 2. Please refer to FIG. 3. Taking one of the first pixels P1 and one of the adjacent second pixels P2 as an example, the switching element SW1 and the switching element SW2 are disposed on the substrate SUB. Taking a bottom gate thin film transistor as an example, the switching element (such as the switching element SW1 and/or the switching element SW2) may include a gate electrode GE, a gate insulation layer GI, a channel layer CH, an ohmic contact layer OC, a source electrode SE, a drain electrode DE, an insulation layer IN, an interconnect layer ILL and an interconnect layer IL2. The gate electrode GE is disposed on the substrate SUB. The gate insulation layer GI is disposed on the gate electrode GE and the substrate SUB. The channel layer CH is disposed on the gate insulation layer GI and is located above the gate electrode GE. The ohmic contact layer OC is disposed on the channel layer CH. The source electrode SE and the drain electrode DE are disposed on the ohmic contact layer OC and the gate insulation layer GI. The insulation layer IN is disposed on the channel layer CH, the source electrode SE, the drain electrode DE, and the gate insulation layer GI. In one embodiment, the interconnect layer IL1 is electrically connected to the source electrode SE through a through-hole H1 of the insulation layer IN. The interconnect layer 112 is electrically connected to the drain electrode DE through a through-hole H2 of the insulation layer IN.

Although FIG. 3 shows the bottom gate thin film transistor as one of the embodiments of the switching element SW1 and the switching element SW2, the structure or type of the switching element SW1 and the switching element SW2 are not limited thereto.

The photoelectric element LS1 and the photoelectric element LS2 are respectively disposed on the switching element SW1 and the switching element SW2. Taking a photodiode as an example, the photosensitive element (such as the photosensitive element LS1 or the photosensitive element LS2) may include a bottom electrode (such as a bottom electrode LS1BE or a bottom electrode LS2BE), a top electrode (such as a top electrode LS or a top electrode LS2TE), and the photoelectric conversion layer (such as the photoelectric conversion layer PCL1 or the photoelectric conversion layer PCL2). In detail, the photosensitive element LS1 includes the bottom electrode LS1BE (also referred to as a first bottom electrode), the top electrode LS1TE (also referred to as a first top electrode), and the photoelectric conversion layer PCL1 (also referred to as a first photoelectric conversion layer). Similarly, the photosensitive element LS2 includes the bottom electrode LS2BE (also referred to as a second bottom electrode), the top electrode LS2TE (also referred to as a second top electrode), and the photoelectric conversion layer PCL2 (also referred to as a second photoelectric conversion layer). In an embodiment, a junction line between the first pixel P1 and the second pixel P2 may be defined by a data line (not shown) and a gate line (not shown). For example, a junction line I in FIG. 2 corresponds to the position of the data line and the gate line of the disclosure and may be regarded as the junction line of the first pixel P1 and the second pixel P2.

The bottom electrode is electrically connected to the switching element (such as the switching element SW1 or the switching element SW2); for example, the bottom electrode LS1BE may be electrically connected to the interconnect layer IL1 of the switching element SW1. The top electrode and the bottom electrode are disposed correspondingly. "Corresponding" in the disclosure means that the top electrode and the bottom electrode at least partially overlap in the normal direction D3 of the substrate SUB. The photoelectric conversion layer (such as the photoelectric conversion layer PCL1 or the photoelectric conversion layer PCL2) is located between the bottom electrode (such as the bottom electrode LS1BE or the bottom electrode LS2BE) and the top electrode (such as the top electrode LS1TE or the top electrode LS2TE). In an embodiment, the photoelectric conversion layer contacts the bottom electrode and the top electrode. The top electrode and the bottom electrode are adapted to provide a negative bias to the photoelectric conversion layer. In detail, according to the design requirements, both the top electrode and the bottom electrode may be negatively biased, or one may be positively biased and the other negatively biased (for example, the top electrode is positively biased, and the bottom electrode is negatively biased), but the disclosure is not limited thereto, as long as the total voltage provided by both to the photoelectric conversion layer is negatively biased. The material of the top electrode and the bottom electrode may include transparent conductive material or opaque conductive material. For example, the material of the top electrode and/or the bottom electrode may include metal oxides, such as indium tin oxide (ITO), metals, alloys, or a combination of at least two of the above-mentioned, but the disclosure is not limited thereto. In another embodiment, the material of the top electrode and/or the bottom electrode may include indium tin oxide (ITO). The photoelectric conversion layer PCL may include a P-type semiconductor layer and an N-type semiconductor layer. In some embodiments, the photoelectric conversion layer may further include an intrinsic semiconductor layer or a low-doped P-type semiconductor layer, and the intrinsic semiconductor layer or the low-doped P-type semiconductor layer may be disposed between the P-type semiconductor layer and the N-type semiconductor layer.

In an embodiment of the disclosure, the photoelectric conversion layers PCL of two adjacent pixels (such as the first pixel P1 and the adjacent second pixel P2) belong to different layers. As shown in FIG. 3, the photoelectric conversion layer PCL1 of the first pixel P1 and the photoelectric conversion layer PCL2 of the second pixel P2 belong to different layers. In the disclosure, "different layer" refers to a distance DT2 between the photoelectric conversion layer PCL2 of the second pixel P2 and the substrate SUB being greater than a distance DT1 between the photoelectric conversion layer PCL1 of the first pixel P1 and the substrate SUB. The distance DT2 refers to the maximum distance between a surface (for example, a surface PCL2-A) of the photoelectric conversion layer PCL2 outside a through-hole H5A and closer to the substrate SUB and an upper surface SUB-A of the substrate SUB, and the distance DT1 refers to the maximum distance between a surface (for example, a surface PCL1-A) of the photoelectric conversion layer PCL1 outside a through-hole H3 and closer to the substrate SUB and the upper surface SUB-A of the substrate SUB. On the other hand, "a first layer and a second layer belonging to the same layer" means that the first layer and the second layer are formed on a same reference surface, where the reference surface refers to a surface roughly parallel to the upper surface SUB-A of the substrate; or the first layer and the second layer belong to the same process; or the first layer and the second are both disposed on and in contact with a certain layer. Taking FIG. 3 as an example, the gate electrodes GE of the switching element SW 1 and the gate electrodes GE of the switching element SW2 belong to the same layer. The interconnect layer IL1 and the interconnect layer IL2 of the switching element SW1 and the interconnect layer IL1 and the interconnect layer IL2 of the switching element SW2 belong to the same layer.

As shown in FIG. 3, the sensing panel 10 may further include an insulation layer IN1, an insulation layer IN2, an insulation layer IN3, an insulation layer IN4, a bias circuit BC, a first auxiliary circuit AC1, and a second auxiliary circuit AC2. In an embodiment, the insulation layer IN1, the insulation layer IN2, the insulation layer IN3, the insulation layer IN4, the bias circuit BC, the first auxiliary circuit AC1, and the second auxiliary circuit AC2 are disposed on the substrate SUB.

Please refer to FIG. 3. The insulation layer IN1 inside the first pixel P1 is disposed on the switching element SW1 and the insulation layer IN. The bottom electrode LS1BE is disposed on the insulation layer IN1 and extends into the through-hole H3 of the insulation layer IN1 and contacts the interconnect layer ILL The photoelectric conversion layer PCL1 is disposed on the bottom electrode LS1BE and fills the through-hole H3. The insulation layer IN2 is disposed on the photoelectric conversion layer PCL1. The top electrode LS1TE is disposed on the insulation layer IN2 and extends into a through-hole H4 of the insulation layer IN2 and is electrically connected to the photoelectric conversion layer PCL1. The insulation layer IN3 is disposed on the top electrode LS and the insulation layer IN2 and fills the through-hole H4. The insulation layer IN4 is disposed on the insulation layer IN3. The top electrode LS2TE of the second pixel P2 is disposed on the insulation layer IN4 and extends into a through-hole H6 of the insulation layer IN4 and a through-hole H5 of the insulation layer IN3 and contacts the top electrode LS1TE of the first pixel P1. In other words, the top electrode LS2TE of the second pixel P2 is electrically connected to the top electrode LS1TE the first pixel P1, and the top electrode LS2TE of the second pixel P2 and the top electrode LS1E of the first pixel P1 overlap in the normal direction D3 of the substrate SUB, where the top electrode LS1TE of the first pixel P1 is located between the top electrode LS2TE of the second pixel P2 and the photoelectric conversion layer PCL1 of the first pixel P1.

The insulation layer IN1 inside the second pixel P2 is disposed on the switching element SW2 and the insulation layer IN. Specifically, the first auxiliary circuit AC1 is disposed on the insulation layer IN1, and the first auxiliary circuit AC1 and the bottom electrode LS1BE of the first pixel P1 may belong to the same layer. The first auxiliary circuit AC1 may extend into a through-hole H3A of the insulation layer IN1 and contacts the interconnect layer IL1 of the switching element SW2. In other words, the first auxiliary circuit AC1 and the switching element SW2 of the second pixel P2 are electrically connected. The insulation layer IN2 is disposed on the first auxiliary circuit AC1 and the insulation layer IN1 and fills the through-hole H3A. In one embodiment, the second auxiliary circuit AC2 is disposed on the insulation layer IN2, and the second auxiliary circuit AC2 and the top electrode LS1TE of the first pixel P1 belong to the same layer. The second auxiliary circuit AC2 may extend into a through-hole H4A of the insulation layer IN2 and contact the first auxiliary circuit AC1. In other words, the second auxiliary circuit AC2 and the first auxiliary circuit AC1 are electrically connected. The insulation layer IN3 is disposed on the second auxiliary circuit AC2 and the insulation layer IN2 and fills the through-hole H4A. The bottom electrode LS2BE of the photosensitive element LS2 is disposed on the insulation layer IN3 and extends into the through-hole H5A of the insulation layer IN3 and contacts the second auxiliary circuit AC2. The bottom electrode LS2BE may be electrically connected to the switching element SW2 through the second auxiliary circuit AC2 and the first auxiliary circuit AC1, where the first auxiliary circuit AC1 is located between the switching element SW2 of the second pixel P2 and the photosensitive element LS2, and the second auxiliary circuit AC2 is located between the first auxiliary circuit AC1 and the bottom electrode LS2BE. The photoelectric conversion layer PCL2 of the photosensitive element LS2 is disposed on the bottom electrode LS2BE and fills the through-hole HSA. The insulation layer IN4 is disposed on the photoelectric conversion layer PCL2. The top electrode LS2TE of the photosensitive element LS2 is disposed on the insulation layer IN4 and extends into a through-hole H6A of the insulation layer IN4 and contact the photoelectric conversion layer PCL2. In some embodiments, the photoelectric conversion layer PCL2 may extend into the first pixel P1, and the photoelectric conversion layer PCL1 may extend into the second pixel P2, increasing the fill factor of the photosensitive elements in the x-ray device 1 to greater than 100%, for example, thus improving the image quality of the x-ray device 1.

The bias circuit BC is disposed on the substrate SUB. In some embodiments, the bias circuit BC may be located on the side of the switching element SW2 near the switching element SW1; that is, the bias circuit BC may be located between the switching element SW1 of the first pixel P1 and the switching element SW2 of the second pixel P2. In some embodiments, the bias circuit BC may be electrically connected to the top electrode LS1TE of the first pixel P1 and the top electrode LS2TE of the second pixel P2. In an embodiment, the first pixel P1 and the second pixel P2 may share the bias circuit BC. In another embodiment, the bias circuit BC and the photoelectric conversion layer PCL2 at least partially overlap in the direction D3. For example, the bias circuit BC may include a first electrode E1, the insulation layer IN, a second electrode E2, and an interconnect layer IL3. The first electrode E1 is disposed on the gate insulation layer GI. The insulation layer IN is disposed on the first electrode E1. The second electrode E2 is disposed on the insulation layer IN and extends into a through-hole H1A of the insulation layer IN and contacts the first electrode E1. In other words, the second electrode E2 and the first electrode are electrically connected. The insulation layer IN1 is disposed on the second electrode E2 and the insulation layer IN. The interconnect layer IL3 is disposed on the insulation layer IN1 and extends into a through-hole H3B of the insulation layer IN1 and contacts the second electrode E2. In other words, the interconnect layer IL3 and the second electrode E2 are electrically connected. In some embodiments, the top electrode LS may extend into the second pixel P2 and extend into a through-hole H4B of the insulation layer IN2 and be electrically connected to the interconnect layer IL3 of the bias circuit BC, and the top electrode LS may be electrically insulated from the bottom electrode LS2BE through the insulation layer IN3. In addition, the top electrode LS2TE may be electrically connected to the bias circuit BC through the top electrode LS1TE. In some embodiments of the disclosure, the top electrode LS may extend into the second pixel P2 and be electrically connected to the interconnect layer IL3 through the through-hole H4B, and the top electrode LS2TE may extend into the first pixel P1 and be electrically connected to the interconnect layer IL3 of the bias circuit BC through the top electrode LS1TE.

Since the photoelectric conversion layers of two adjacent pixels (such as the first pixel P1 and the adjacent second pixel P2) belong to different layers, the photoelectric conversion layers of the two adjacent pixels do not contact each other; therefore, the photoelectric conversion layers of the two adjacent pixels need not keep a distance in the first direction D1 (or in the second direction D2). In an embodiment, as shown in FIG. 3, the edge of the photoelectric conversion layer of the first pixel P1 and the edge of the photoelectric conversion layer of the adjacent second pixel P2 may be very close to the junction line I of the two pixels. In another embodiment, the edge of the photoelectric conversion layer of the first pixel P1 (or the second pixel P2) may extend beyond the junction line I into the second pixel P2 (or the first pixel P1). In other words, the photoelectric conversion layer PCL1 and the adjacent photoelectric conversion layer PCL2 may not overlap, be substantially aligned, or at least partially overlap in the normal direction D3 of the substrate SUB.

By increasing the area of the photoelectric conversion layer, the photoelectric conversion layer receives more photons, and the amount of signal received by the photosensitive element is increased. As a result, the Signal-to-Noise Ratio (SNR) can be effectively increased or the image quality can be improved. In addition, the irradiation amount of the x-ray can be reduced when the same amount of signal is received. Moreover, as shown in FIG. 3, the first pixel P1 and the adjacent second pixel P2 may share the bias circuit BC, and the bias circuit PC may be disposed below the photoelectric conversion layer PCL2 of the second pixel P2; that is, the photoelectric conversion layer PCL2 and the bias circuit BC may overlap or at least partially overlap in the normal direction D3 of the substrate SUB. By disposing the photoelectric conversion layer PCL2 above the bias circuit BC, the probability that the bias circuit BC hinders the photoelectric conversion layer PCL2 from absorbing photons can be reduced. In this way, by increasing the area of the photoelectric conversion layer, the shielding rate of the photoelectric conversion layer can be reduced, thus effectively increasing the fill factor and improving the image quality of the x-ray device 1. In an embodiment of the disclosure, the fill factor can be effectively increased to be more than or equal to 80%, 95%, or close to 100% according to different parameter designs (such as the transmittance of the film layer disposed on the photoelectric conversion layer PCL, the ratio of the photoelectric conversion layer being covered, the material of the photoelectric conversion layer, or the like) and process factors. In another embodiment, the conductive layer (such as the top electrode TE) disposed on the photoelectric conversion layer PCL may be a transparent conductive layer to further increase the fill factor. The transparent conductive layer may include transparent conductive material, or include a metal mesh electrode layer, but the disclosure is not limited thereto.

It should be noted that although FIG. 3 shows that the first pixel P1 and the adjacent second pixel P2 share one bias circuit BC, in other embodiments, the first pixel P1 and the adjacent second pixel P2 may each have one bias circuit BC. In addition, although FIG. 2 and FIG. 3 show that the photoelectric conversion materials in the x-ray device 1 include two different layers, in other embodiments, the photoelectric conversion materials in the x-ray device 1 may include three or more different layers; that is, the photoelectric conversion materials may be further stacked upwards as required.

Figure 4A:
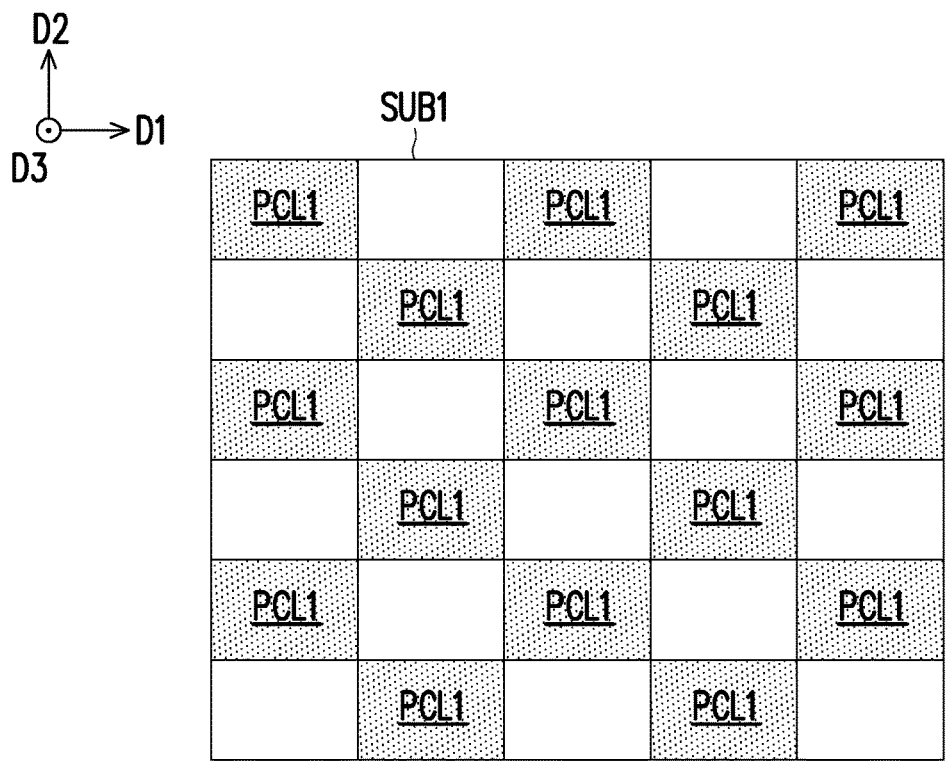
FIG. 4A is a schematic top view of a first substrate and multiple photosensitive elements in an X-ray device according to another embodiment of the disclosure.
Figure 4B:
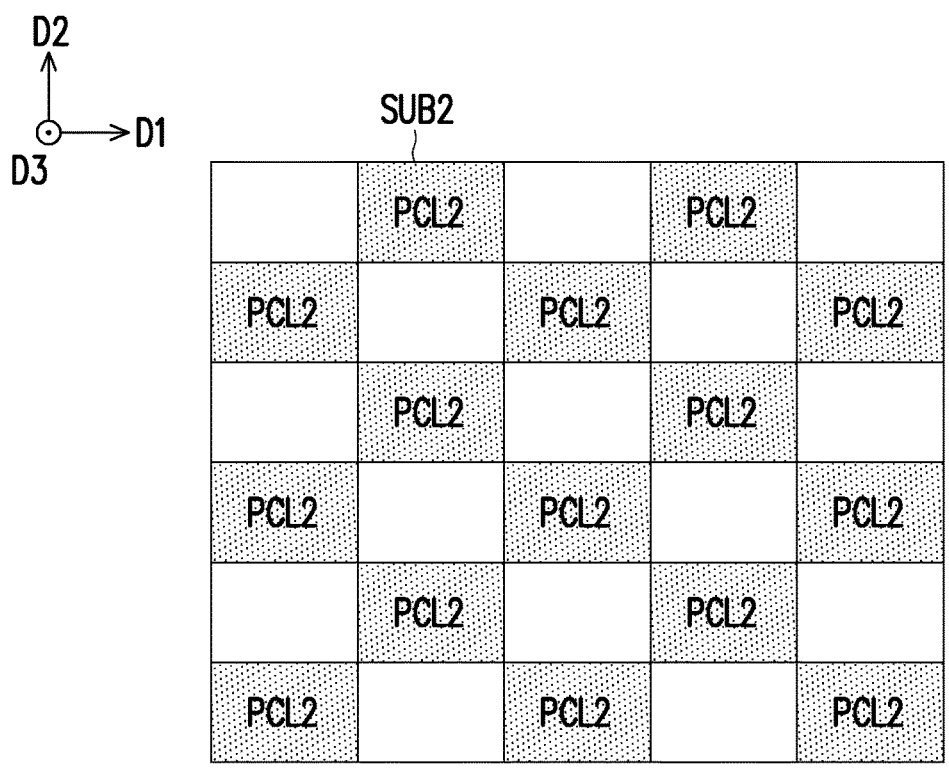
FIG. 4B is a schematic top view of a second substrate and multiple photosensitive elements in an X-ray device according to another embodiment of the disclosure.
Figure 4C:
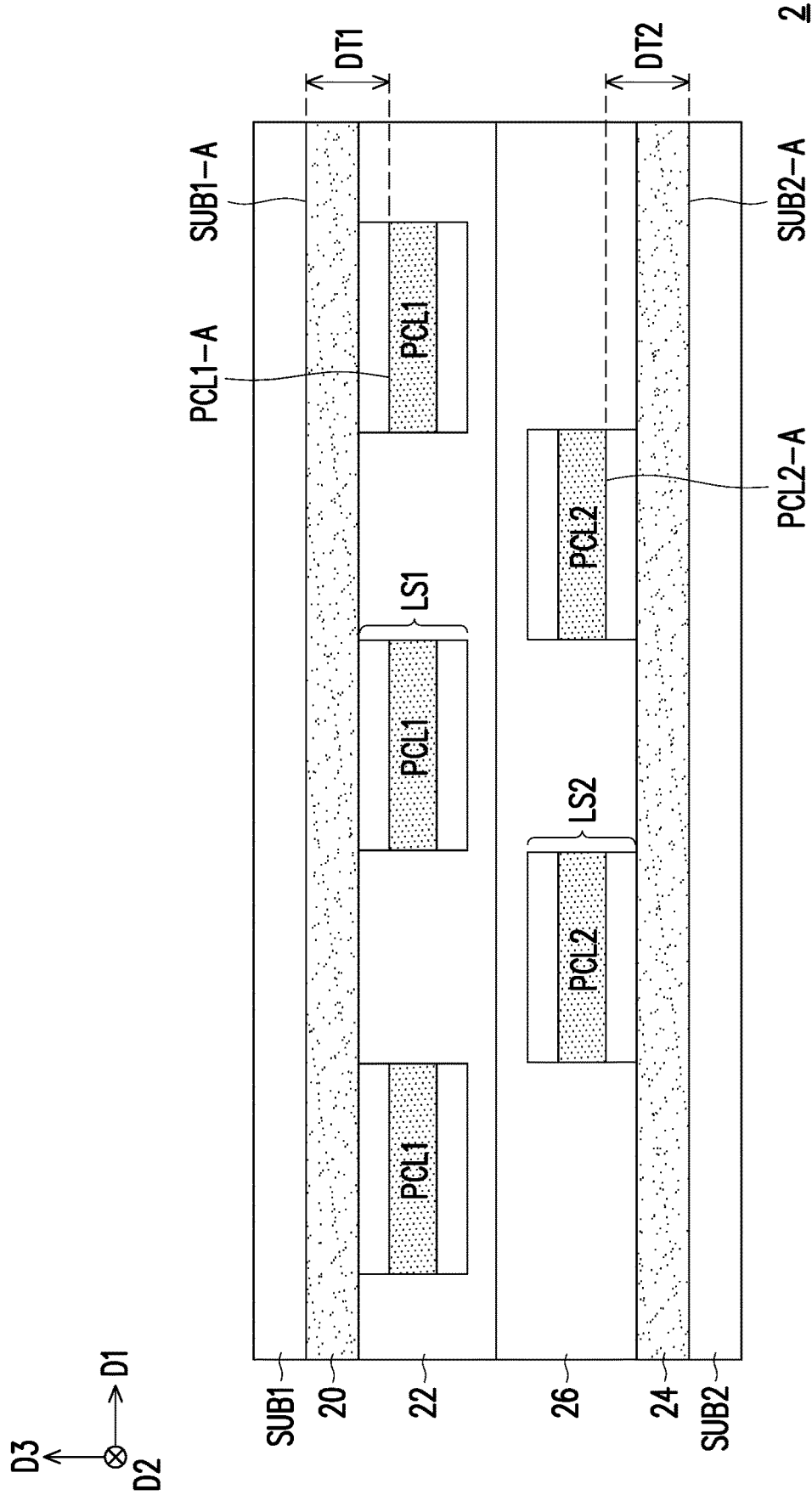
FIG. 4C is a schematic cross-sectional view of an X-ray device according to another embodiment of the disclosure.

FIG. 4A and FIG. 4B are schematic top views of a substrate SUB1 and the multiple photoelectric conversion layers PCL1 and a substrate SUB2 and the multiple photoelectric conversion layers PCL2, respectively, of an x-ray device 2 in another embodiment of the disclosure. FIG. 4C is a schematic cross-sectional view of an X-ray device according to another embodiment of the disclosure. Please refer to FIG. 4A to FIG. 4C. A sensing panel in the x-ray device 2 may include two substrates disposed correspondingly, such as the substrate SUB1 and the substrate SUB2; in some embodiments, the x-ray device 2 includes multiple photosensitive elements (such as multiple photosensitive elements LS1 and multiple photosensitive elements LS2). In some embodiments, the multiple photosensitive elements (such as the multiple photosensitive elements LS1) may be disposed on the substrate SUB1 and located between the substrate SUB1 and the substrate SUB2. Each photosensitive element includes the photoelectric conversion layer PCL1. The photoelectric conversion layers PCL1 of the multiple photosensitive elements may be disposed at intervals in the first direction D1 and the second direction D2, as shown in FIG. 4A, for example, where the multiple photoelectric conversion layers PCL1 are staggered. The multiple photosensitive elements (such as the multiple photosensitive elements LS2) may also be disposed on the substrate SUB2 and located between the substrate SUB1 and the substrate SUB2. Each photosensitive element disposed on the substrate SUB2 includes the photoelectric conversion layers PCL2, as shown in FIG. 4B, for example, where the multiple photoelectric conversion layers PCL2 are staggered. It is worth noting that FIG. 4A and FIG. 4B are only an embodiment of the disclosure and the disclosure is not limited thereto. In another embodiment, the junction line of the multiple photoelectric conversion layers PCL1 and/or the multiple photoelectric conversion layers PCL2 may not need to be aligned to each other. For example, at least two of the multiple photoelectric conversion layers PCL1 or the multiple photoelectric conversion layers PCL2 may partially overlap in the second direction D2.

Please refer to FIG. 4C. The x-ray device 2 may further include a first element layer 20, a first function layer 22, a second element layer 24, and a second function layer 26. The first element layer 20 is disposed on the substrate SUB1 and located between the multiple photosensitive elements LS1 and the substrate SUB1. The first element layer 20 may include a switching element (not shown) or a bias circuit (not shown), but the disclosure is not limited thereto. The first function layer 22 is disposed on the first element layer 20. The first element layer 22 may include an insulation layer (not shown) or a flat layer (not shown), but the disclosure is not limited thereto. The detailed structure of the first function layer 22 and its relative dispositional relationship with the first element layer 20 and the multiple photosensitive elements LS1 can be referred to in FIG. 3 and will not be repeated here. Similarly, the second element layer 24 is disposed on the substrate SUB2 and located between the multiple photosensitive elements LS2 and the substrate SUB2. The second element layer 24 may include a switching element (not shown) or a bias circuit (not shown), but the disclosure is not limited thereto. The second function layer 26 is disposed on the second element layer 24. The second function layer 26 may include an insulation layer (not shown) or a flat layer (not shown), but the disclosure is not limited thereto. The detailed structures of the second element layer 24 and the second function layer 26 and their relative dispositional relationship with the multiple photosensitive elements LS2 can be referred to in the multiple photosensitive elements LS1, the first element layer 20 and the first function layer 22, and will not be repeated here.

As shown in FIG. 4C, after the substrate SUB1 and the substrate SUB2 are disposed correspondingly, when viewed from the normal direction D3 of the x-ray device 2, the multiple photoelectric conversion layers PCL1 and the multiple photoelectric conversion layers PLC2 may be alternately disposed in the first direction D1 and the second direction D2. In some embodiments, the distance DT1 between at least one of the multiple photoelectric conversion layers PCL1 and the substrate SUB1 in the normal direction (such as the normal direction D3) of the substrate SUB1 may be substantially equal to the distance DT2 between at least one of the multiple photoelectric conversion layers PCL2 and the substrate SUB2 in the normal direction (such as the normal direction D3) of the second substrate SUB2. In an embodiment, the distance DT1 may be the maximum distance in the normal direction D3 between a surface (such as the surface PCL1-A) of the photoelectric conversion layer PCL1 closest to the substrate SUB1 and a surface SUB1-A of the substrate SUB1 closest to the photoelectric conversion layer PCL1; the distance DT2 may be the maximum distance in the normal direction D3 between a surface (such as the surface PCL2-A) of the photoelectric conversion layer PCL2 closest to the substrate SUB2 and a surface SUB2-A of the substrate SUB2 closest to the photoelectric conversion layer PCL2.

In summary, in the embodiments of the disclosure, since the photoelectric conversion layers of two adjacent pixels belong to different layers, the area of the photoelectric conversion layer can be effectively increased. In addition, a circuit (such as a bias circuit) between two adjacent pixels may be disposed below one photoelectric conversion layer of the two adjacent pixels to reduce that the circuit hinders the photoelectric conversion layers from absorbing photons. In this way, the area of the photoelectric conversion layer can be effectively increased, or the shielding rate of the photoelectric conversion layer can be reduced, thus effectively increasing the fill factor. Therefore, the image quality of the x-ray device described in the embodiments of the disclosure can be increased.

The embodiments are only used to illustrate, not to limit, the technical solutions for the disclosure; although the disclosure has been described in detail with reference of the above-mentioned embodiments, those with ordinary skill in the art should understand that they can still modify the technical solutions described in the above-mentioned embodiments, or equivalently replace some or all of the technical features while the modifications or substitutions do not deviate the essence of the corresponding technical solutions from the scope of the technical solutions of the embodiments of the disclosure.

Although the embodiments and advantages of the disclosure have been disclosed as above, it should be understood that any person with ordinary skill in the art may make changes, substitutions, and modifications without departing from the spirit and scope of the disclosure, and the features among the embodiments can be arbitrarily mixed and replaced to form other new embodiments. In addition, the protection scope of the disclosure is not limited to the manufacturing processes, machines, manufacturings, material compositions, devices, methods, or steps in the specific embodiments described in the disclosure; from the contents disclosed in the disclosure, any person with ordinary skill in the art can understand current or future processes, machines, manufacturings, material compositions, devices, methods, and steps from the disclosure and use them according to the disclosure, as long as approximately the same functions can be implemented or approximately the same results can be achieved. Therefore, the protection scope of the disclosure includes the above processes, machines, manufacturings, material compositions, devices, methods, or steps. In addition, each claim constitutes an individual embodiment, and the protection scope of the disclosure also includes the combination of each claim and embodiment. The scope of protection disclosed in the disclosure shall be subject to the scope defined in the accompanying claims.

What is claimed is:

1. An X-ray device, comprising:
   a sensing panel, the sensing panel comprising:
   at least one first pixel; and
   at least one second pixel, disposed adjacent to the at least one first pixel in a top view direction,
   wherein the at least one first pixel comprises a first switching element and a first photosensitive element disposed on the first switching element, the at least one second pixel comprises a second switching element and a second photosensitive element disposed on the second switching element,
   wherein the first photosensitive element comprises a first photoelectric conversion layer, the second photosensitive element comprises a second photoelectric conversion layer, and the first photoelectric conversion layer and the second photoelectric conversion layer belong to different layers.

2. The x-ray device according to claim 1, wherein the first photosensitive element comprises:
   a first bottom electrode; and
   a first top electrode disposed on the first bottom electrode, wherein the first photoelectric conversion layer is disposed between the first bottom electrode and the first top electrode.

3. The x-ray device according to claim 2, wherein the second photosensitive element comprises:
   a second bottom electrode; and
   a second top electrode disposed on the second bottom electrode, wherein the second photoelectric conversion layer is disposed between the second bottom electrode and the second top electrode.

4. The x-ray device according to claim 3, wherein the second top electrode and the first top electrode overlap in the top view direction, and the first top electrode is located between the second top electrode and the first photoelectric conversion layer.

5. The x-ray device according to claim 3, further comprising:
   a bias circuit disposed on a substrate, wherein the first top electrode is electrically connected to the bias circuit, and the second top electrode is electrically connected to the bias circuit via the first top electrode.

6. The x-ray device according to claim 5, wherein the bias circuit is located between the first switching element and the second switching element, and the second photoelectric conversion layer of the at least one second pixel and the bias circuit overlap in the top view direction.

7. The x-ray device according to claim 3, wherein the at least one second pixel comprises:
   a first auxiliary circuit located between the second switching element and the second photosensitive element, and the first auxiliary circuit is electrically connected to the second switching element; and a second auxiliary circuit located between the first auxiliary circuit and the second bottom electrode, and the second auxiliary circuit is electrically connected to the first auxiliary circuit and the second bottom electrode.

8. The x-ray device according to claim 1, wherein a quantity of the at least one first pixel is more than one and a quantity of the at least one second pixel is more than one, wherein the plurality of first pixels and the plurality of second pixels are alternately disposed in a first direction and a second direction, wherein the first direction is different from the second direction, and the first direction and the second direction are perpendicular to a normal direction of a substrate.

\* \* \* \* \*